(12) United States Patent
Fritsch et al.

(10) Patent No.: US 9,536,608 B1
(45) Date of Patent: Jan. 3, 2017

(54) CONTENT ADDRESSABLE MEMORY DEVICE

(71) Applicant: International Business Machines Corporation, Armonk, NY (US)

(72) Inventors: Alexander Fritsch, Esslingen (DE); Amira Rozenfeld, Herzeliyya (IL); Gordon B. Sapp, Austin, TX (US); Rolf Sautter, Bondorf (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/943,152

(22) Filed: Nov. 17, 2015

(51) Int. Cl.
  *G11C 15/00* (2006.01)
  *G11C 15/04* (2006.01)

(52) U.S. Cl.
  CPC ..................... *G11C 15/04* (2013.01)

(58) Field of Classification Search
  CPC ...................................... G11C 15/04
  USPC ............................ 365/49.17, 51, 49.1, 49.15
  See application file for complete search history.

(56) References Cited

U.S. PATENT DOCUMENTS

| | | | | |
|---|---|---|---|---|
| 6,421,265 B1 * | 7/2002 | Lien | ........................ | G11C 15/04 365/189.05 |
| 6,487,101 B1 * | 11/2002 | Ashbrook | ............... | G11C 15/04 365/49.17 |
| 6,665,220 B2 | 12/2003 | Vlasenko | | |
| 7,120,732 B2 | 10/2006 | Braceras et al. | | |
| 7,391,633 B2 * | 6/2008 | Dudeck | .................. | G11C 15/04 365/185.2 |
| 7,414,872 B2 | 8/2008 | Wang | | |
| 7,525,827 B2 | 4/2009 | Chang et al. | | |
| 7,570,537 B2 * | 8/2009 | Bhatia | ................... | G11C 11/412 365/154 |
| 7,661,042 B2 | 2/2010 | Matsuoka et al. | | |
| 8,169,807 B2 | 5/2012 | Dosaka et al. | | |
| 8,441,828 B2 * | 5/2013 | Watanabe | .............. | G11C 15/04 365/49.1 |
| 2002/0075713 A1 | 6/2002 | Hellner et al. | | |
| 2003/0081464 A1 * | 5/2003 | Vlasenko | ............... | G11C 15/00 365/200 |
| 2006/0062038 A1 * | 3/2006 | Kang | ..................... | G11C 15/00 365/49.17 |

(Continued)

OTHER PUBLICATIONS

Chang, Shu-Wei, et al., "A Novel Butterfly Match-Line Scheme With Don'T-Care Based Hierarchical Search-Line for TCAM", <http://lpsoc.eic.nctu.edu.tw/pub/A%20Novel%20Butterfly%20Match-Line/%20Scheme%20with%20Don't-Care%20Based%20Hierarchical%20Search-Line%20for%20TCAM.pdf>.

(Continued)

*Primary Examiner* — Viet Q Nguyen
(74) *Attorney, Agent, or Firm* — Kevin Kehe

(57) ABSTRACT

Disclosed aspects include a content addressable memory device comprising at least two memory banks connectable to a global search line. Each memory bank comprises at least two content addressable memory cells. Each content addressable memory cell can store one bit. Each content addressable memory cell is coupled to a respective local search line. Aspects include a bank connection circuitry configured for coupling the global search line to the local search lines in dependence of a bank prediction signal line. The bank connection circuitry of the content addressable memory device may comprise bank hold circuitry for storing a search value transmitted by the global search line.

20 Claims, 5 Drawing Sheets

(56) References Cited

U.S. PATENT DOCUMENTS

| | | | | | |
|---|---|---|---|---|---|
| 2006/0233011 | A1* | 10/2006 | Matsuoka | ................ | G06F 7/74 |
| | | | | | 365/49.17 |
| 2007/0247885 | A1* | 10/2007 | Watanabe | .............. | G11C 15/04 |
| | | | | | 365/49.17 |
| 2008/0062804 | A1* | 3/2008 | Wang | .................... | G11C 15/00 |
| | | | | | 365/230.03 |
| 2008/0175030 | A1* | 7/2008 | Chang | ................... | G11C 15/04 |
| | | | | | 365/49.1 |
| 2009/0190404 | A1* | 7/2009 | Roohparvar | ........ | G11C 15/046 |
| | | | | | 365/185.17 |
| 2009/0201709 | A1* | 8/2009 | Inoue | .................... | G11C 15/04 |
| | | | | | 365/49.17 |
| 2014/0078818 | A1* | 3/2014 | Chuang | ............... | G11C 11/413 |
| | | | | | 365/154 |

OTHER PUBLICATIONS

Pagiamtzis, K., et al., "A Low-Power Content-Addressable Memory (CAM) Using Pipelined Hierarchical Search Scheme" ,Solid-State Circuits, IEEE Journal of (vol. 39, Issue: 9), pp. 1512-1519, Date of Publication: Sep. 2004.

Wang, Jinn-Shyan, et al., "TCAM for IP-Address Lookup Using Tree-Style and-Type Match Lines and Segmented Search Lines", Solid-State Circuits Conference, 2006. ISSCC 2006. Digest of Technical Papers. IEEE International, Date of Conference: Feb. 6-9, 2006, pp. 577-586.

* cited by examiner

CONTENT ADDRESSABLE MEMORY DEVICE

BACKGROUND

The present invention generally relates to memory architecture, and more specifically, to methods and systems for content addressable memory (CAM).

Content addressable memory, also called "associative memory", is a type of storage device, which includes comparison logic with each bit of storage. A data value is broadcasted to all words of the storage and compared with the data values in storage. Words that match are flagged in some way. Subsequent operations can then work on flagged words, e.g., read the flagged words out one at a time or write to certain bit positions in all of the flagged words.

Digital integrated circuits including content addressable memory may be used for a diverse number of electronic applications, from simple devices such as wristwatches to the most complex computer systems.

For mobile devices, power consumption of digital integrated circuits is of interest.

SUMMARY

Aspects of the disclosure include a content addressable memory device comprising at least two memory banks connectable to a global search line. Each memory bank comprises at least two content addressable memory cells. Each content addressable memory cell can store one bit. Each content addressable memory cell is coupled to a respective local search line.

Aspects of the disclosure include a bank connection circuitry configured for coupling the global search line to the local search lines in dependence of a bank prediction signal line. The bank connection circuitry of the content addressable memory device may comprise bank hold circuitry for storing a search value transmitted by the global search line.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
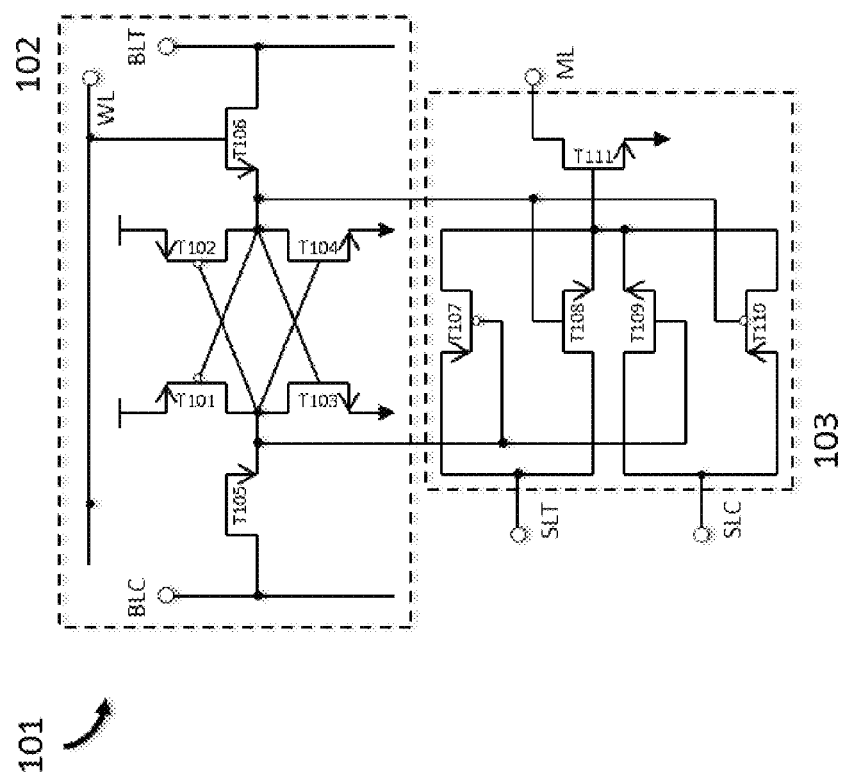
FIG. 1 shows a content addressable memory cell according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

In view of the foregoing, there may be a need for a content addressable memory device which provides performance or efficiency benefits such as consuming less power.

According to a first aspect, the disclosure relates to a content addressable memory device comprising at least two memory banks connectable to a global search line. Each memory bank comprises at least two content addressable memory cells. Each content addressable memory cell can store one bit. Each content addressable memory cell is coupled to a respective local search line. Disclosed aspects include a bank connection circuitry configured for coupling the global search line to the local search lines in dependence of a bank prediction signal line.

In a first embodiment, the content addressable memory device the bank connection circuitry may comprise bank hold circuitry for storing a search value transmitted by the global search line. Storing a search value may reduce power consumption as the number of voltage switches on the search lines may be reduced. Moreover, due to the shorter local search lines leading to reduced effective capacitance thereof the read-out speed of the content addressable memory device may be improved.

Furthermore, the bank hold circuitry is adapted to store the search value and the complement search value.

Moreover, an embodiment may provide a content addressable memory device, wherein each memory bank is connectable to the global search line and a complement global search line, wherein each content addressable memory cell is coupled to the respective local search line and a respective complement local search line, and wherein the bank connection circuitry is configured for coupling the global search line to the local search lines and the complement global search line to the complement local search lines, respectively, in dependence of a bank prediction signal line.

The present invention may be better understood, and its numerous objects, features, and advantages made apparent to those skilled in the art by referencing the accompanying drawings.

FIG. 1 discloses a content addressable memory cell 101. The content addressable memory cell 101 includes a memory cell 102 and comparison logic 103.

The memory cell 102 consists of four field effect transistors (FETs), two NFETs T101 and T102 as well as two PFETs T103 and T104, forming a flip-flop for storing one bit of data and two further FETs T105 and T106 for addressing the memory cell 102. The memory cell 102 may thus be considered as a 6T-SRAM cell.

The output and the inverted output of the flip-flop are connected to the comparison logic 103. Moreover, a search line and a complement of the search line, i.e. a complement search line, are coupled to the comparison logic 103. Furthermore, the comparison logic 103 is connected to a match line for outputting the result of the comparison.

In the exemplary embodiment, the comparison logic 103 is implemented as an XOR-cell. Alternatively, the comparison logic may also be implemented as NAND-cell or AND-cell.

The comparison logic 103 comprises five FETs T107 to T111. The sources of the four FETs T107 to T110 are connected to the gate of the NFET T111. The drains of the PFET T107 and the NFET T108 are connected to the search line SLT9 and the sources of the NFET T109 and the PFET T110 are connected to the complement search line SLC.

In case the state of the flip-flop matches with the state of the search line SLT the NFET T111 will open and pull the match line ML to VSS.

The content addressable memory cell shown in FIG. 1 uses a search line SLT and the complement SLC. However, if the comparison logic 103 is implemented as NAND-cell or AND-cell the search line SLT, also called the true line, might be sufficient.

Figure 2:
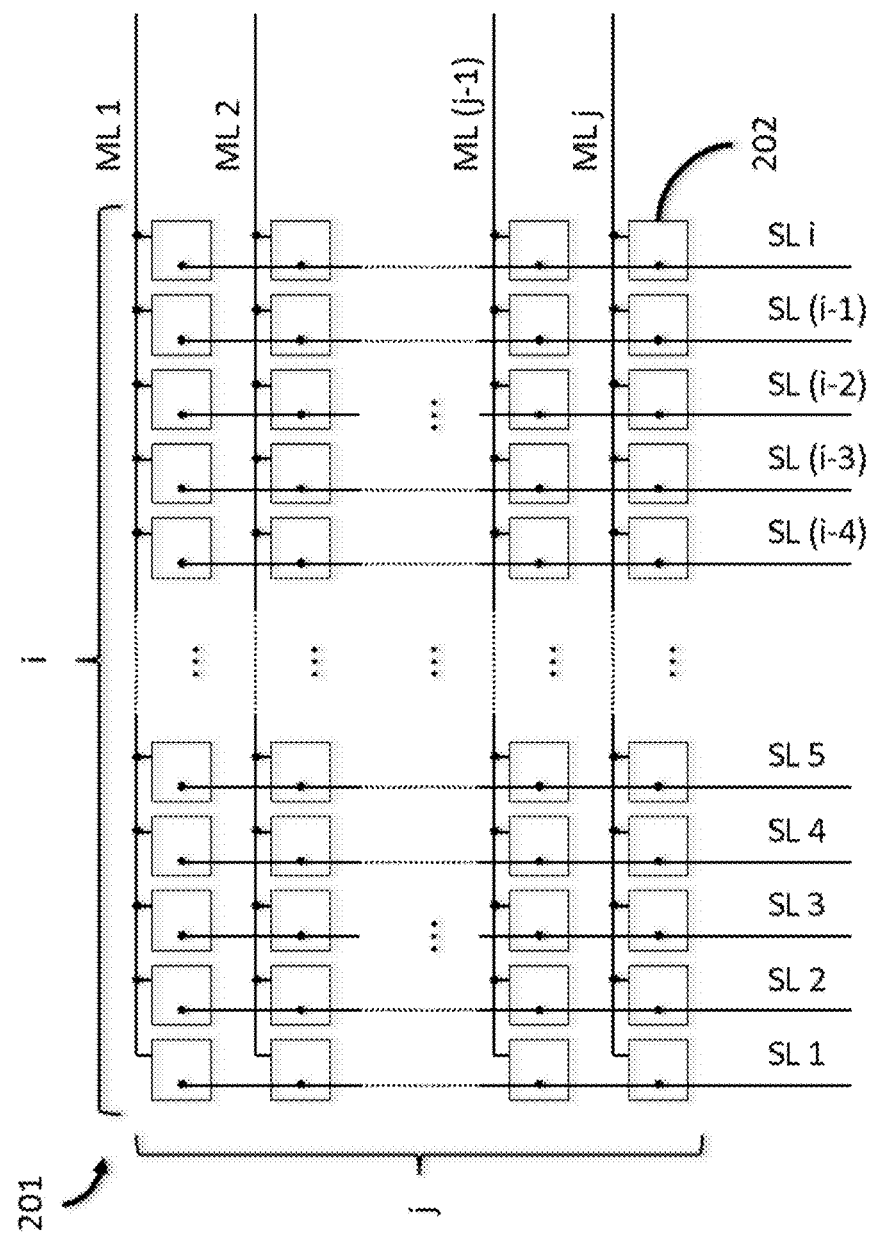
FIG. 2 shows a content addressable memory block according to embodiments.

FIG. 2 shows a content addressable memory device 201 comprising an array of content addressable memory cells 202. The content addressable memory device 201 comprises j words each having i bits. In an exemplary embodiment, i may be 20. Search lines SL1 to SLi are connected to the content addressable memory cells 202, wherein the first search line SL1 is connected to the first bit of every word. The outputs of the content addressable memory cells 202 constituting one word are connected to a common match line ML 1 to ML j, respectively. Only if the content of every content addressable memory cell 202 of the respective word matches the state of the respective search line SL 1 to SL the respective match line assumes the value "0". In the embodiment pursuant to FIG. 2 all entries take part in each search. This may lead to long search lines inducing high search loads, high power consumption during search and a high slew on the search lines.

Figure 3:
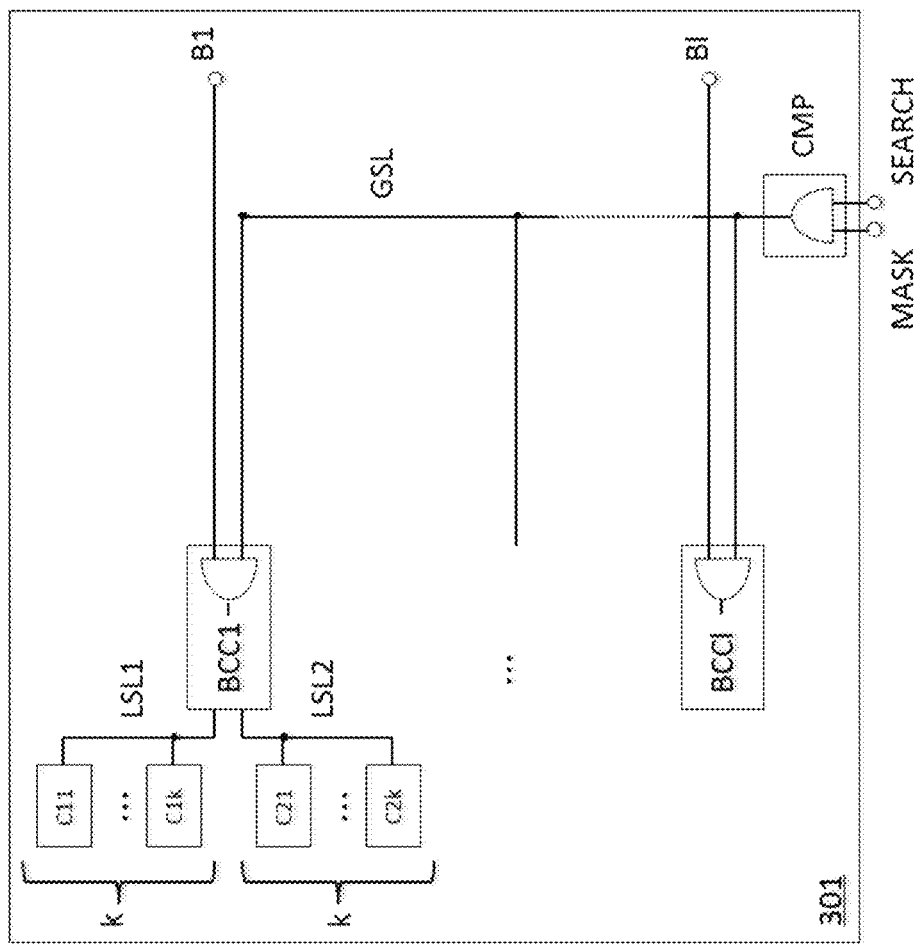
FIG. 3 shows another content addressable search line concept according to embodiments.

FIG. 3 discloses another content addressable memory device 301. The content addressable memory device 301 comprises a first word consisting of content addressable memory cells C11 to C1k and a second word consisting of content addressable memory cells C21 to C2k. The first and the second word are addressed by local search lines LSL1 and LSL2, respectively. The local search lines LSL1 and LSL2 are connected to a bank connection circuitry BCC1. Similarly, local search lines are connected up to bank connection circuitry BCC1. Upon receipt of signal on the bank prediction signal line B1 the bank connection circuitry couples the local k-bit search lines to the global k-bit search line GSL. The search value may be applied to the global search line GSL by comparing a k-bit mask with a search signal.

In contrast to the content addressable memory device 201 not all content addressable memory cells take part during search but only those selected by the respective bank connection circuitry. Splitting the search lines in local search lines and a global search line may considerably reduce search loads, power consumption and slow on the search lines. Moreover, the global search line will be provided at a higher layer of the content addressable memory device 301 having a better RC-delay characteristic.

Figure 4:
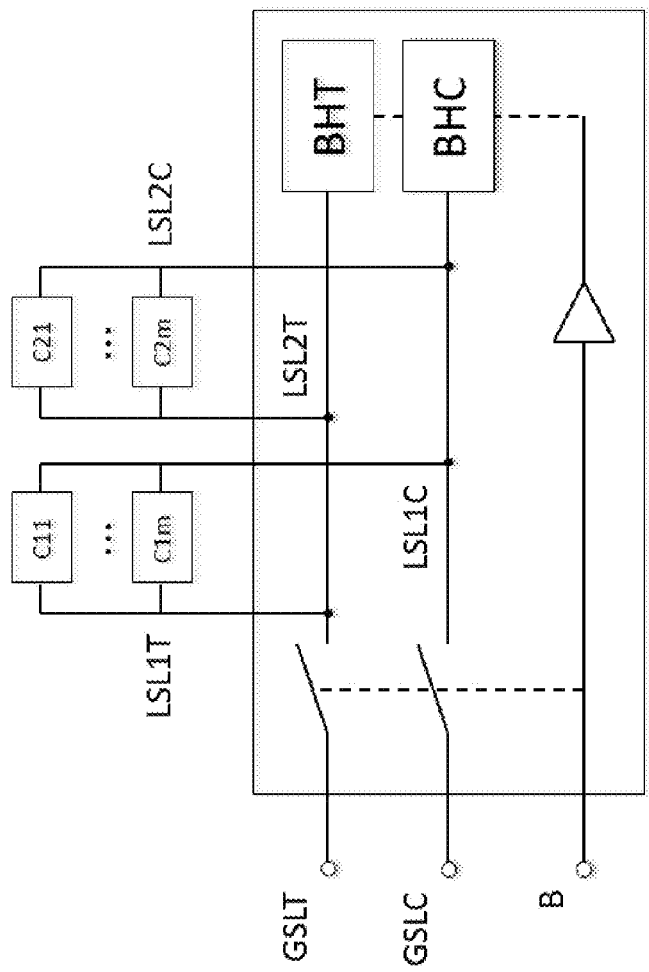
FIG. 4 shows a still further content addressable search line concept according to embodiments.

A still further content addressable memory device is shown in FIG. 4. The content assessable memory cells C11 to C1m and C21 to C2m are addressed via local search lines LSL1T and LSL2T as well as complement local search lines LSL1C and LSL2C each having a width of m bit. As has been explained with respect to the content addressable memory device 301 of FIG. 3, the local search lines LSL1T and LSL2T and the complement local search lines LSL1C and LSL2C may be coupled to the respective global search line GSLT and complement global search line GSLC. In addition to the content addressable memory device 301 of FIG. 3, the content addressable memory device 401 comprises bank hold circuitry BHT and BHC for storing the last value applied to the local search lines LSL1T and LSL2T and the complement local search lines LSL1C and LSL2C via the global search line and the complement global search line, respectively. Storing these values avoids switching activity on the local search lines and complement local search lines and further reduce power consumption.

Figure 5:
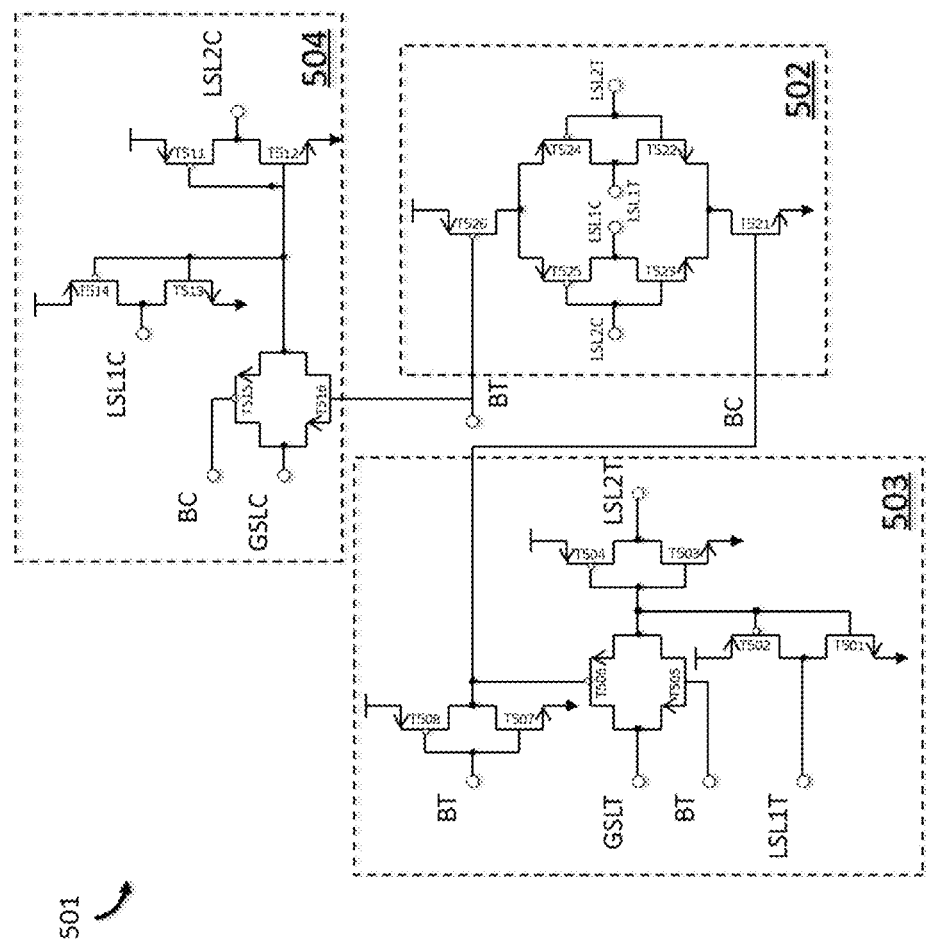
FIG. 5 shows a bank connection circuitry according to embodiments.

FIG. 5 shows an exemplary bank hold connection circuitry 501 in greater detail. The bank hold connection circuitry 501 comprises circuitry 503 for coupling the local search lines LSL1T and LSL2T to the global search line GSLT upon receipt of a signal on the bank prediction signal line BT. Comparably, the bank hold connection circuitry 501 comprises circuitry 504 for coupling the complement local search lines LSL1C and LSL2C to the complement global search line GSLC in response to a signal transmitted on the complement bank prediction signal line BC. Furthermore, the bank connection circuitry 501 comprises a bank hold circuitry 502 for storing the last true and complement values applied to the local search lines LSL1T and LSL2T and the complement local search lines LSL1C and LSL2C.

In particular, the bank connection circuitry comprises an NFET T501, whose source is connected to VSS and whose drain is connected to the local search line LSL1T, a PFET T502, whose source is connected to the local search line LSL1T and whose drain is connected to VDD, an NFET T503, whose source is connected to VSS and whose drain is connected to a local search line LSL2T, a PFET T504, whose source is connected to the local search line LSL2T and whose drain is connected to VDD, an NFET T505, whose source is connected to the global search line GSLT, whose drain is connected to the gates of the NFET T501, the PFET T502, the NFET T503 and the PFET T504, and whose gate is connected to the bank prediction signal line BT, a PFET T506, whose source is connected to the global search line GSLT, and whose drain is connected to the drain of the third NFET T505. The interconnection of the FETs T501 to T506 allows for applying the signal on the global search line to the local search lines LSL1T and LSL2T upon receipt of s signal on the bank prediction signal line BT and a complement signal on the complement bank prediction line BC.

For establishing a complement bank prediction line signal, an NFET T507, whose source is connected to VSS, whose drain is connected to the gate of the PFET T506, and whose gate is connected to the bank prediction signal line BT, as well as a PFET T508, whose source is connected to the drain of the NFET T507, whose drain is connected to VDD, and whose gate is connected to the bank prediction signal line, may be provided.

For establishing a connection between the complement global search line and the complement local search lines LSL1C and LSL2C, the bank connection circuitry may comprise an NFET T513, whose source is connected to VSS and whose drain is connected to the complement local search line LSL1C, a PFET T514, whose source is connected to the complement local search line LSL1C and whose drain is connected to VDD, an NFET T512, whose source is connected to VSS and whose drain is connected to the complement local search line LSL2C, a PFET T511, whose source is connected to the complement local search line LSL2C and whose drain is connected to VDD, an NFET T516, whose source is connected to the complement global search line GSLC, whose drain is connected to the gates of the NFET T513, the PFET T514, the NFET T512 and the PFET T511, and whose gate is connected to the bank prediction signal line BT, and a PFET T515, whose source is connected to the complement global search line GSLT, whose drain is connected to the drain of the NFET T516.

For storing the values, which have been lately applied to the local search lines LSL1T and LSL2T and the complement local search lines LSL1C and LSL2C there may be provided an NFET T521, whose source is connected to VSS and whose gate is connected to the complement bank prediction signal line BC, a PFET T526, whose drain is connected to VDD and whose gate is connected to the bank prediction signal line BC, an NFET T522, whose source is connected to the drain of the NFET T521, whose drain is connected to the local search line LSL1T, and whose gate is connected to the local search line LSL2T, a PFET T524, whose source is connected to the local search line LSL1T, whose drain is connected to the source of the PFET T526, and whose gate is connected to the local search line LSL2T, an NFET T523, whose source is connected to the drain of the NFET T521, whose drain is connected to the complement local search line LSL1C, and whose gate is connected to the complement local search line LSL2C, and a PFET T525, whose source is connected to the drain of the NFET T523, whose drain is connected to the source of the PFET T526, and whose gate is connected to the complement local search line LSL2C.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A content addressable memory device comprising:
    at least two memory banks connectable to a global search line,
        wherein each memory bank comprises
            at least two content addressable memory cells,
                wherein each content addressable memory cell can store one bit,
                wherein each content addressable memory cell is coupled to a respective local search line; and
            a bank connection circuitry having:
                a first NFET, whose source is connected to VSS and whose drain is connected to a first local search line,
                a first PFET, whose source is connected to the first local search line and whose drain is connected to VDD.

2. The content addressable memory device according to claim 1,
    wherein the bank connection circuitry comprises bank hold circuitry for storing a search value transmitted by the global search line.

3. The content addressable memory device according to claim 1,
    wherein the bank hold circuitry is adapted to store the search value and the complement search value.

4. The content addressable memory device according to claim 1,
    wherein each memory bank is connectable to the global search line and a complement global search line,
    wherein each content addressable memory cell is coupled to the respective local search line and a respective complement local search line,
    wherein the bank connection circuitry is configured for coupling the global search line to the local search lines and the complement global search line to the complement local search lines, respectively, in dependence of a bank prediction signal line.

5. The content addressable memory device according to claim 4,
    wherein the bank connection circuitry comprises
        a second NFET, whose source is connected to VSS and whose drain is connected to a second local search line,
        a second PFET, whose source is connected to the second local search line and whose drain is connected to VDD,
        a third NFET, whose source is connected to the global search line, whose drain is connected to the gates of the first NFET, the first PFET, the second NFET and the second PFET, and whose gate is connected to the bank prediction signal line,
        a third PFET, whose source is connected to the global search line, whose drain is connected to the drain of the third NFET, and whose gate is connected to the complement bank prediction signal line.

6. The content addressable memory device according to claim 4,
    wherein the bank connection circuitry comprises
        a second NFET, whose source is connected to VSS and whose drain is connected to a second local search line,
        a second PFET, whose source is connected to the second local search line and whose drain is connected to VDD,
        a third NFET, whose source is connected to the global search line, whose drain is connected to the gates of the first NFET, the first PFET, the second NFET and the second PFET, and whose gate is connected to the bank prediction signal line,
        a third PFET, whose source is connected to the global search line, whose drain is connected to the drain of the third NFET,
        a fourth NFET, whose source is connected to VSS, whose drain is connected to the gate of the third PFET, and whose gate is connected to the bank prediction signal line,
        a fourth PFET, whose source is connected to the drain of the fourth NFET, whose drain is connected to VDD, and whose gate is connected to the bank prediction signal line.

7. The content addressable memory device according to claim 4,
    wherein the bank connection circuitry comprises
        a second NFET, whose source is connected to VSS and whose drain is connected to a second local search line,
        a second PFET, whose source is connected to the second local search line and whose drain is connected to VDD,
        a third NFET, whose source is connected to the global search line, whose drain is connected to the gates of the first NFET, the first PFET, the second NFET and the second PFET, and whose gate is connected to the bank prediction signal line,
        a third PFET, whose source is connected to the global search line, whose drain is connected to the drain of the third NFET, and whose gate is connected to the complement bank prediction signal line,
        a fourth NFET, whose source is connected to VSS and whose gate is connected to the complement bank prediction signal line, a fourth PFET, whose drain is connected to VDD and whose gate is connected to the bank prediction signal line, a fifth NFET, whose source is connected to the drain of the fourth NFET, whose drain is connected to the first local search line, and whose gate is connected to the second local search line, a fifth PFET, whose source is connected to the first local search line, whose drain is connected to the source of the fourth PFET, and whose gate is connected to the second local search line, a sixth NFET, whose source is connected to the drain of the fourth NFET, whose drain is connected to the complement first local search line, and whose gate is connected to the complement second local search line, a sixth PFET, whose source is connected to the drain of the sixth NFET, whose drain is connected to the source of the fourth PFET, and whose gate is connected to the complement second local search line.

8. The content addressable memory device according to claim 4, wherein the bank connection circuitry comprises a second NFET, whose source is connected to VSS and whose drain is connected to a second local search line, a second PFET, whose source is connected to the second local search line and whose drain is connected to VDD, a third NFET, whose source is connected to the global search line, whose drain is connected to the gates of the first NFET, the first PFET, the second NFET and the second PFET, and whose gate is connected to the bank prediction signal line, a third PFET, whose source is connected to the global search line, whose drain is connected to the drain of the third NFET, a fourth NFET, whose source is connected to VSS, whose drain is connected to the gate of the third PFET, and whose gate is connected to the bank prediction signal line, a fourth PFET, whose source is connected to the drain of the fourth NFET, whose drain is connected to VDD, and whose gate is connected to the bank prediction signal line, a fifth NFET, whose source is connected to VSS and whose gate is connected to the complement bank prediction signal line, a fifth PFET, whose drain is connected to VDD and whose gate is connected to the bank prediction signal line, a sixth NFET, whose source is connected to the drain of the fifth NFET, whose drain is connected to the first local search line, and whose gate is connected to the second local search line, a sixth PFET, whose source is connected to the first local search line, whose drain is connected to the source of the fifth PFET, and whose gate is connected to the second local search line, a seventh NFET, whose source is connected to the drain of the fifth NFET, whose drain is connected to the complement first local search line, and whose gate is connected to the complement second local search line, a seventh PFET, whose source is connected to the drain of the seventh NFET, whose drain is connected to the source of the fifth PFET, and whose gate is connected to the complement second local search line.

9. The content addressable memory device according to claim 4, wherein the bank connection circuitry comprises a second NFET, whose source is connected to VSS and whose drain is connected to a second local search line, a second PFET, whose source is connected to the second local search line and whose drain is connected to VDD, a third NFET, whose source is connected to the global search line, whose drain is connected to the gates of the first NFET, the first PFET, the second NFET and the second PFET, and whose gate is connected to the bank prediction signal line, a third PFET, whose source is connected to the global search line, whose drain is connected to the drain of the third NFET, a fourth NFET, whose source is connected to VSS, whose drain is connected to the gate of the third PFET, and whose gate is connected to the bank prediction signal line, a fourth PFET, whose source is connected to the drain of the fourth NFET, whose drain is connected to VDD, and whose gate is connected to the bank prediction signal line, a fifth NFET, whose source is connected to VSS and whose gate is connected to the complement bank prediction signal line, a fifth PFET, whose drain is connected to VDD and whose gate is connected to the bank prediction signal line, a sixth NFET, whose source is connected to the drain of the fifth NFET, whose drain is connected to the first local search line, and whose gate is connected to the second local search line, a sixth PFET, whose source is connected to the first local search line, whose drain is connected to the source of the fifth PFET, and whose gate is connected to the second local search line, a seventh NFET, whose source is connected to the drain of the fifth NFET, whose drain is connected to the complement first local search line, and whose gate is connected to the complement second local search line, a seventh PFET, whose source is connected to the drain of the seventh NFET, whose drain is connected to the source of the fifth PFET, and whose gate is connected to the complement second local search line, a eighth NFET, whose source is connected to VSS and whose drain is connected to the complement first local search line, a eighth PFET, whose source is connected to the complement first local search line and whose drain is connected to VDD, a ninth NFET, whose source is connected to VSS and whose drain is connected to the complement second local search line, a ninth PFET, whose source is connected to the complement second local search line and whose drain is connected to VDD, a tenth NFET, whose source is connected to the complement global search line, whose drain is connected to the gates of the eighth NFET, the eighth PFET, the ninth NFET and the ninth PFET, and whose gate is connected to the bank prediction signal line, a tenth PFET, whose source is connected to the complement global search line, whose drain is connected to the drain of the tenth NFET.

10. The content addressable memory device according to claim 1,
wherein the bank connection circuitry is configured for coupling the global search line to the local search lines.

11. The content addressable memory device according to claim 1,
wherein the bank connection circuitry is configured for coupling the global search line to the local search lines in dependence of a bank prediction signal line.

12. The content addressable memory device according to claim 11,
wherein the bank connection circuitry comprises
a second NFET, whose source is connected to VSS and whose drain is connected to a second local search line,
a second PFET, whose source is connected to the second local search line and whose drain is connected to VDD,
a third NFET, whose source is connected to the global search line, whose drain is connected to the gates of the first NFET, the first PFET, the second NFET and the second PFET, and whose gate is connected to the bank prediction signal line,
a third PFET, whose source is connected to the global search line, whose drain is connected to the drain of the third NFET, and whose gate is connected to the complement bank prediction signal line.

13. The content addressable memory device according to claim 11,
wherein the bank connection circuitry comprises
a second NFET, whose source is connected to VSS and whose drain is connected to a second local search line,
a second PFET, whose source is connected to the second local search line and whose drain is connected to VDD,
a third NFET, whose source is connected to the global search line, whose drain is connected to the gates of the first NFET, the first PFET, the second NFET and the second PFET, and whose gate is connected to the bank prediction signal line,
a third PFET, whose source is connected to the global search line, whose drain is connected to the drain of the third NFET,
a fourth NFET, whose source is connected to VSS, whose drain is connected to the gate of the third PFET, and whose gate is connected to the bank prediction signal line,
a fourth PFET, whose source is connected to the drain of the fourth NFET, whose drain is connected to VDD, and whose gate is connected to the bank prediction signal line.

14. The content addressable memory device according to claim 11,
wherein the bank connection circuitry comprises
a second NFET, whose source is connected to VSS and whose drain is connected to a second local search line,
a second PFET, whose source is connected to the second local search line and whose drain is connected to VDD, a third NFET, whose source is connected to the global search line, whose drain is connected to the gates of the first NFET, the first PFET, the second NFET and the second PFET, and whose gate is connected to the bank prediction signal line,
a third PFET, whose source is connected to the global search line, whose drain is connected to the drain of the third NFET, and whose gate is connected to the complement bank prediction signal line,
a fourth NFET, whose source is connected to VSS and whose gate is connected to the complement bank prediction signal line,
a fourth PFET, whose drain is connected to VDD and whose gate is connected to the bank prediction signal line,
a fifth NFET, whose source is connected to the drain of the fourth NFET, whose drain is connected to the first local search line, and whose gate is connected to the second local search line,
a fifth PFET, whose source is connected to the first local search line, whose drain is connected to the source of the fourth PFET, and whose gate is connected to the second local search line,
a sixth NFET, whose source is connected to the drain of the fourth NFET, whose drain is connected to the complement first local search line, and whose gate is connected to the complement second local search line,
a sixth PFET, whose source is connected to the drain of the sixth NFET, whose drain is connected to the source of the fourth PFET, and whose gate is connected to the complement second local search line.

15. The content addressable memory device according to claim 11,
wherein the bank connection circuitry comprises
a second NFET, whose source is connected to VSS and whose drain is connected to a second local search line,
a second PFET, whose source is connected to the second local search line and whose drain is connected to VDD,
a third NFET, whose source is connected to the global search line, whose drain is connected to the gates of the first NFET, the first PFET, the second NFET and the second PFET, and whose gate is connected to the bank prediction signal line,
a third PFET, whose source is connected to the global search line, whose drain is connected to the drain of the third NFET,
a fourth NFET, whose source is connected to VSS, whose drain is connected to the gate of the third PFET, and whose gate is connected to the bank prediction signal line,
a fourth PFET, whose source is connected to the drain of the fourth NFET, whose drain is connected to VDD, and whose gate is connected to the bank prediction signal line,
a fifth NFET, whose source is connected to VSS and whose gate is connected to the complement bank prediction signal line,
a fifth PFET, whose drain is connected to VDD and whose gate is connected to the bank prediction signal line,
a sixth NFET, whose source is connected to the drain of the fifth NFET, whose drain is connected to the first local search line, and whose gate is connected to the second local search line, a sixth PFET, whose source is connected to the first local search line, whose drain is connected to the source of the fifth PFET, and whose gate is connected to the second local search line, a seventh NFET, whose source is connected to the drain of the fifth NFET, whose drain is connected to the complement first local search line, and whose gate is connected to the complement second local search line, a seventh PFET, whose source is connected to the drain of the seventh NFET, whose drain is connected to the source of the fifth PFET, and whose gate is connected to the complement second local search line.

16. The content addressable memory device according to claim 11,
wherein the bank connection circuitry comprises
a second NFET, whose source is connected to VSS and whose drain is connected to a second local search line,
a second PFET, whose source is connected to the second local search line and whose drain is connected to VDD,
a third NFET, whose source is connected to the global search line, whose drain is connected to the gates of the first NFET, the first PFET, the second NFET and the second PFET, and whose gate is connected to the bank prediction signal line,
a third PFET, whose source is connected to the global search line, whose drain is connected to the drain of the third NFET,
a fourth NFET, whose source is connected to VSS, whose drain is connected to the gate of the third PFET, and whose gate is connected to the bank prediction signal line,
a fourth PFET, whose source is connected to the drain of the fourth NFET, whose drain is connected to VDD, and whose gate is connected to the bank prediction signal line,
a fifth NFET, whose source is connected to VSS and whose gate is connected to the complement bank prediction signal line,
a fifth PFET, whose drain is connected to VDD and whose gate is connected to the bank prediction signal line,
a sixth NFET, whose source is connected to the drain of the fifth NFET, whose drain is connected to the first local search line, and whose gate is connected to the second local search line,
a sixth PFET, whose source is connected to the first local search line, whose drain is connected to the source of the fifth PFET, and whose gate is connected to the second local search line,
a seventh NFET, whose source is connected to the drain of the fifth NFET, whose drain is connected to the complement first local search line, and whose gate is connected to the complement second local search line,
a seventh PFET, whose source is connected to the drain of the seventh NFET, whose drain is connected to the source of the fifth PFET, and whose gate is connected to the complement second local search line,
a eighth NFET, whose source is connected to VSS and whose drain is connected to the complement first local search line,
a eighth PFET, whose source is connected to the complement first local search line and whose drain is connected to VDD,
a ninth NFET, whose source is connected to VSS and whose drain is connected to the complement second local search line,
a ninth PFET, whose source is connected to the complement second local search line and whose drain is connected to VDD,
a tenth NFET, whose source is connected to the complement global search line, whose drain is connected to the gates of the eighth NFET, the eighth PFET, the ninth NFET and the ninth PFET, and whose gate is connected to the bank prediction signal line,
a tenth PFET, whose source is connected to the complement global search line, whose drain is connected to the drain of the tenth NFET.

17. The content addressable memory device according to claim 11,
wherein the bank connection circuitry comprises bank hold circuitry for storing a search value transmitted by the global search line.

18. The content addressable memory device according to claim 11,
wherein the bank hold circuitry is adapted to store the search value and the complement search value.

19. The content addressable memory device according to claim 11,
wherein each memory bank is connectable to the global search line and a complement global search line,
wherein each content addressable memory cell is coupled to the respective local search line and a respective complement local search line,
wherein the bank connection circuitry is configured for coupling the global search line to the local search lines and the complement global search line to the complement local search lines, respectively, in dependence of a bank prediction signal line.

20. The content addressable memory device according to claim 10,
wherein the bank connection circuitry comprises bank hold circuitry for storing a search value transmitted by the global search line, and
wherein the bank hold circuitry is adapted to store the search value and the complement search value.

* * * * *